United States Patent

Tseng

[11] Patent Number: 5,834,349
[45] Date of Patent: Nov. 10, 1998

[54] METHOD FOR FABRICATING MEMORY CELLS USING CHEMICAL MECHANICAL POLISHING TECHNOLOGY

[75] Inventor: Horng-Huei Tseng, Hsinchu, Taiwan

[73] Assignee: Vanguard International Semiconductor Corporation, Hsin-Chu, Taiwan

[21] Appl. No.: 755,869

[22] Filed: Dec. 2, 1996

[51] Int. Cl.⁶ ............................................. H01L 21/8242
[52] U.S. Cl. ........................... 438/253; 438/254; 438/397
[58] Field of Search .................................. 434/47, 48, 50, 434/52, 60, 919; 438/238, 239, 253–255, 396–398

[56] References Cited

U.S. PATENT DOCUMENTS

| | | | |
|---|---|---|---|
| 4,944,836 | 7/1990 | Beyer et al. | 156/645 |
| 5,084,405 | 1/1992 | Fazan et al. | 437/52 |
| 5,332,685 | 7/1994 | Park et al. | 437/52 |
| 5,364,813 | 11/1994 | Koh | 437/52 |
| 5,386,382 | 1/1995 | Ahn | 365/174 |
| 5,429,980 | 7/1995 | Yang et al. | 437/52 |
| 5,607,874 | 3/1997 | Wang et al. | 437/52 |

Primary Examiner—Joni Chang
Attorney, Agent, or Firm—George O. Saile; Stephen B. Ackerman

[57] ABSTRACT

A method for manufacturing an array of stacked capacitors with increased capacitance on a dynamic random access memory (DRAM) device was achieved using chemical mechanical polishing (CMP). The invention utilizes CMP to planarize a polysilicon layer in which the capacitor bottom electrodes are formed using two masking steps and a self-aligning etch-back step to form a very high density array of capacitors for DRAM devices. The method involves depositing and then planarizing a thick first polysilicon layer by CMP over a partially completed DRAM cell. A patterned silicon oxide layer with portions aligned over the node contact openings of the pass transistors (FETs) is formed. Silicon nitride sidewall spacers are formed on the vertical sidewalls of the silicon oxide and a thermal oxide is grown on the first polysilicon layer. After selectively removing the nitride spacers, the polysilicon is etched to form deep trenches with inner sidewalls for the bottom electrodes. The oxide etch mask layers are removed and a second photoresist mask is used to define the outer perimeter (sidewalls) of the array of bottom electrodes. An interelectrode dielectric layer is formed on the bottom electrodes and a second polysilicon layer is deposited and patterned to form the top electrodes and to complete the array of stacked capacitors on the DRAM device.

11 Claims, 4 Drawing Sheets

METHOD FOR FABRICATING MEMORY CELLS USING CHEMICAL MECHANICAL POLISHING TECHNOLOGY

BACKGROUND OF THE INVENTION

(1) Field of the Invention

This invention relates to an integrated circuit semiconductor device, and more particularly, to a method for fabricating an array of dynamic random access memory (DRAM) cells having stacked capacitors with increased capacitance using chemical mechanical polishing technology.

(2) Description of the Prior Art

In recent years there has been a dramatic increase in the integrated circuit density on semiconductor substrates and the semiconductor chips formed therefrom. The increase in circuit density has resulted from the downsizing of the individual semiconductor devices and the resulting increase in device packing density. This reduction in device size is a result of advances in high resolution photolithography, directional (anisotropic) plasma etching, and other semiconductor technology innovations, such as the use of self-aligning techniques. However, this reduction in device size is putting additional demand on the semiconductor processing technologies and more specifically on the device electrical requirements.

The DRAM chip used in the electronics industry for storing information is one of the circuit types experiencing this demand for increased density. The circuit on the DRAM chip consists in part of an array of individual DRAM storage cells that store binary data (bits) as electrical charge on a storage capacitor. This information is stored or retrieved from the storage capacitor by means of a pass transistor on each memory cell, and by address and read/write circuits on the periphery of the DRAM chip. The pass transistor is usually a field effect transistor (FET) and the single capacitor in each cell is either formed in the semiconductor substrate as a trench capacitor or built over the FET in the cell area as a stacked capacitor. By the year 1998 the number of memory cells (bits) on a DRAM chip is expected to reach about 256 million and by the year 2001 the bit count on the DRAM chip is expected to reach about 1 Gigabits.

With this rapid increase in the number of memory cells on the DRAM chip, and the need to maintain a reasonable chip size with improved circuit performance, the area of the individual cells must be further reduced in size. As the cell size decreases it becomes more difficult to fabricate a stacked capacitor with sufficient capacitance to store the necessary charge to provide an acceptable signal-to-noise level for the read circuit (sense amplifiers) to detect. The reduced charge also necessitates increasing the refresh cycle frequency that periodically restores the charge on these volatile storage cells. This further reduces the performance of the DRAM circuit. Since the capacitor area is limited to the cell size in order to accommodate the multitude of cells on the DRAM chip, it is necessary to explore alternative methods for increasing the capacitance without increasing the lateral area that the capacitor occupies on the substrate surface. In recent years the method of choice is to build stacked capacitors over the pass transistors within each cell area having a vertical extension (third dimension) so as to increase the capacitor area and hence the capacitance.

Many three-dimensional stacked storage capacitor structures have been reported in the literature for increasing the capacitance, but generally require additional processing steps that include additional optical alignment and exposure using photoresist masks. For example, C. Koh in U.S. Pat. No. 5,364,813, teaches a method of forming a fin-shaped-like capacitor. The method includes depositing a polysilicon layer on the substrate having a sacrificial borophosphosilicate glass (BPSG) in which the capacitor node contact openings are etched. The bottom capacitor electrodes are then formed by patterning the polysilicon layer using a photoresist mask aligned to the contact. Another capacitor structure is reported by Y. Park et al., U.S. Pat. No. 5,332,685 in which the bit line and storage node contacts are formed by simultaneously forming polysilicon plugs. The bit lines are then formed from a polysilicon or polycide layer by aligning a photoresist mask and patterning the polysilicon layer. Fork-shaped bottom electrodes are then formed over the storage node contacts adjacent to the bit lines which restrict the size of the electrode or limit the minimum size of the cell area. Still another fork-shaped electrode-type capacitor is reported by J. Ahn, U.S. Pat. No. 5,386,382 in which the bottom electrode of the capacitor is aligned over a conducting plug in the node contact. A related approach to the current invention is described in the pending patent application Ser. No. 08/585,032 filed on Jan. 11, 1996 entitled "A Method for Fabricating a Coaxial Capacitor of a Semiconductor Device" also assigned to the assignee of the current patent application.

As the DRAM cell continues to decrease in size it would be desirable to further simplify the process by reducing the number of processing steps while incorporating self-aligning techniques to minimize the ground rule tolerance and improve the cell density. Therefore, there is still a strong need in the semiconductor industry for making a reliable low cost DRAM product using improved processing steps.

SUMMARY OF THE INVENTION

DRAM cells have decreased in size, for example, the FETs used on the memory cells have channel lengths that are less than a half-micrometer in length. Therefore, it is becoming increasingly more difficult to align one photoresist masking level to the next. To avoid this limitation in alignment tolerances, the present invention provides a method for fabricating the bottom electrodes of the storage capacitors with increasing capacitance while using only two photoresist masking steps, and a planarized polysilicon layer to facilitate the use of a self-aligning process step.

It is therefore a principal object of the present invention to provide a method for fabricating stacked capacitors for an array of DRAM cells having bottom electrodes having portions extending vertically upward, thereby increasing the capacitance.

It is another object of the present invention to fabricate these stacked capacitors using a two-photoresist masking step and a planarized polysilicon layer to employ self-aligning techniques for making the bottom electrodes for the stacked capacitors.

It is still another object of the invention to provide these improved high-capacitance stacked capacitors on DRAM cells using a cost-effective manufacturing process.

The method for fabricating an array of these dynamic random access memory (DRAM) cells begins by first forming an array of device areas on a semiconductor substrate. Typically the substrate is a single crystal silicon substrate doped with a P-type conductive dopant, such as boron (B). The device areas are provided by forming a relatively thick Field OXide (FOX) surrounding and electrically isolating each device area. One method of forming these field oxide areas is by protecting from oxidation the substrate surface where device areas are desired. This is achieved by depositing an oxidation barrier layer, such as a silicon nitride ($Si_3N_4$) layer and patterning the layer leaving portions over the device areas. The exposed field oxide areas on the silicon substrate are then thermally oxidized to form the FOX. This method is typically referred to in the semiconductor industry as the LOCal Oxidation of Silicon (LOCOS) method. After removing the silicon nitride layer a thin gate oxide is formed in the device areas on the silicon substrate. A polycide (polysilicon/silicide) layer having a cap oxide ($SiO_2$) thereon is patterned to form the FET gate electrodes, and interconnecting word lines for the DRAM cells. Lightly doped source/drain areas are formed adjacent to the gate electrodes, usually by ion implantation of an N-type dopant, such as arsenic (As) or phosphorus (P), and then sidewall spacers are formed, by depositing an insulator ($SiO_2$) and anisotropically etching back the layer to the substrate surface. The FETs are then completed by using a second N-type dopant implant to form the FET source/drain contact areas adjacent to the sidewall spacers. A first insulating layer composed of a silicon oxide layer, or alternatively a silicon nitride layer, can be deposited on the silicon oxide layer to provide additional protection from ion contamination. Contact openings are then etched in the first insulating layer to one of the two source/drain contact areas of each FET in the memory cells where node contacts are required.

Now by the method of this invention, the stacked capacitors are formed by first depositing a relatively thick $N^+$ doped first polysilicon layer that makes electrical contact to the node contacts. One key feature of the invention is the planarization of the first polysilicon layer by chemical/mechanical polishing. This allows the reliable formation of sidewall spacers that are used to pattern the bottom electrodes for the stacked capacitors. A second insulating layer is deposited over the planar first polysilicon layer, and conventional photolithographic methods and anisotropic plasma etching are used to pattern the second insulating layer leaving portions aligned over the regions where the stacked capacitors are required. The patterned second insulating layer has essentially vertical sidewalls and also extends over the capacitor node contact openings to the array of FETs. A conformal third insulating layer, composed of a material that provides a barrier to thermal oxidation (e.g., silicon nitride), is deposited over the patterned second insulating layer. The silicon nitride layer is then anisotropically etched back forming sidewall spacers on the sidewalls of the second insulating layer while exposing the underlying first polysilicon layer elsewhere on the substrate. The exposed first polysilicon layer is now thermally oxidized to form a polysilicon oxide while silicon nitride ($Si_3N_4$) spacers prevent oxidation thereunder. A hot phosphoric acid solution is used to selectively remove the $Si_3N_4$ spacers while leaving essentially unetched the silicon oxide layers. This provides a remaining silicon oxide mask consisting of the polysilicon oxide layer and the second insulating layer while providing narrow (equal to the width of the spacers) self-aligned exposed first polysilicon layer regions adjacent to the sidewalls of the second insulating layer. Deep trenches are then anisotropically plasma etched in the first polysilicon layer, such as by a low pressure high density plasma etcher or reactive ion etching, to form the inner sidewalls of the bottom electrodes for the stacked capacitors. The second insulating layer (e.g., CVD silicon oxide) and the polysilicon oxide masking materials are now removed using a wet etch, such as a hydrofluoric (HF) acid solution. Portions of the first polysilicon layer over the trenched areas are now masked using a second photoresist mask, and the exposed polysilicon layer is anisotropically plasma etched to the first insulating layer, thereby forming the outer sidewalls for the vertical portions for the array of bottom electrodes for the stacked capacitors.

The array of DRAM stacked capacitors having these vertical sidewall portions are now completed by forming a thin interelectrode dielectric layer, such as a $SiO_2$-$Si_3N_4$-$SiO_2$ (ONO), on the array of bottom electrodes and then depositing a second $N^+$ doped polysilicon layer to form the stacked capacitor top electrodes.

BRIEF DESCRIPTION OF THE DRAWINGS

The objects and advantages of this invention are best understood with reference to the attached drawings in FIGS. 1 through 7, and the embodiment which follows.

DESCRIPTION OF THE PREFERRED EMBODIMENT

Now in keeping with the objects of this invention, the method for forming walled stacked capacitors on DRAM cells having increased capacitance using chemical mechanical polishing technology is described with reference to FIGS. 1 through 7. The DRAM cells having these types of capacitors are typically formed on a P-doped semiconductor substrates using N-channel field effect transistor (N-FET) structures as the pass transistor in each of the DRAM cells. It should also be well understood by one skilled in the art that by including additional process steps, in addition to those described in this embodiment, other types of devices can also be included on the DRAM chip. For example, by forming N-well regions in the P doped substrate, P-channel FETs can also be provided from which Complementary Metal-Oxide-Semiconductor (CMOS) circuits can also be formed, such as are used for the peripheral circuits on the DRAM chip.

Figure 1:
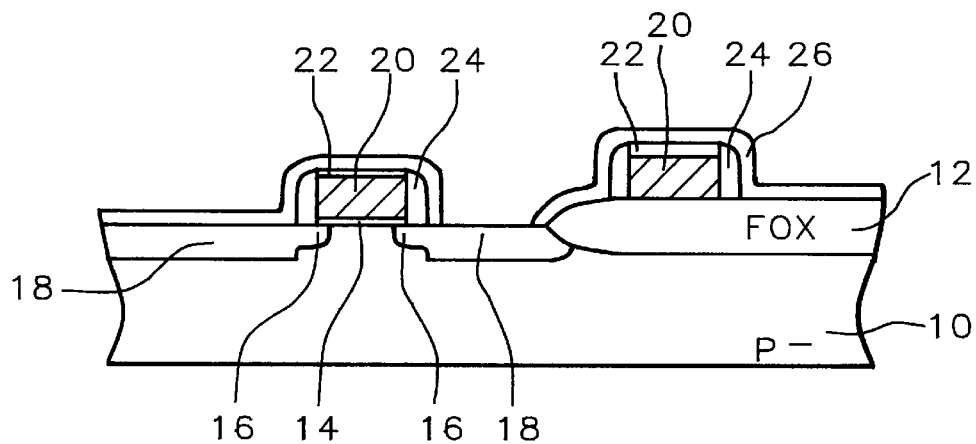
FIGS. 1 through 7 show schematic cross-sectional views for one of the cell regions of an array of DRAM cells illustrating the fabrication steps for a DRAM cell having the stacked capacitor with vertical sidewalls by the method of this invention.

Referring first to FIG. 1, a schematic cross-sectional view of a portion of a semiconductor substrate 10 is shown having a partially completed DRAM cell with a pass transistor (N-FET) formed on and in the substrate surface. The preferred substrate 10 is usually composed of a lightly doped P-type single crystal silicon having preferably a <100> crystallographic orientation. A relatively thick Field OXide (FOX) 12 is formed surrounding and electrically isolating the individual device regions in which the memory cells are built. The field oxide 12, only partially shown in FIG. 1, is most commonly formed by the LOCal Oxidation of Silicon (LOCOS) method. This LOCOS method involves depositing a thin silicon oxide (pad oxide) and a thicker silicon nitride ($Si_3N_4$) layer as an oxidation barrier layer on the substrate surface (not shown in Fig.1), and using conventional photolithographic techniques and etching to remove the barrier layer in areas where a field oxide is desired, while retaining the silicon nitride in areas where active devices are to be fabricated. The silicon substrate is then subjected to a thermal oxidation to form the field oxide areas 12. The oxide is usually grown to a thickness in the range of between about 3000 and 6000 Angstroms.

The array of pass transistors (N-FETs) is now formed in the active device regions after removing the silicon nitride barrier layer and pad oxide in a wet etch. For example, the nitride can be removed in a hot phosphoric acid ($H_3PO_4$)

etch at about 180° C., and the pad oxide can be removed in a dilute solution of hydrofluoric acid and water (HF/H$_2$O). The gate oxide for the N-FETs is formed next in the device areas by thermally oxidizing the active device regions to form a thin gate oxide 14, as shown in FIG. 1. Typically, the thickness of the gate oxide 14 is between about 50 and 150 Angstroms.

Referring still to FIG. 1, the FET gate electrodes in the device areas and the interconnecting word lines on the field oxide 12 are formed next by patterning a polycide layer 20. Preferably the polycide layer 20 is formed by depositing by low pressure chemical vapor deposition (LPCVD) an electrically conducting N$^+$ doped polysilicon layer having on the top surface a refractory metal silicide. The polysilicon is doped by ion implantation using arsenic ions (As$^{75}$) or phosphorus ions (P$^{31}$), and the refractory metal silicide is preferably a tungsten silicide (WSi$_2$) formed by chemical vapor deposition (CVD) using a reactant gas such as tungsten hexafluoride (WF$_6$). Typically the polysilicon layer is between about 1000 and 2000 Angstroms thick, and is doped to a concentration of between about 1.0 E 19 to 1.0 E 21 atoms/cm$^3$. The silicide layer serves to reduce the electrical resistance in the interconnecting word lines and to improve circuit performance. Typically, the WSi$_2$ is about 500 to 1500 Angstroms thick. Prior to patterning the silicide layer, a cap oxide 22 is deposited on layer 20. The cap oxide 22, usually composed of silicon oxide (SiO$_2$), is also deposited using LPCVD by decomposing a reactant gas, such a tetraethosiloxane (TEOS), and is provided over the silicide to electrically insulate the gate electrodes from the bit lines that are formed at a later process step that is not described in this embodiment. Typically, the thickness of the cap oxide layer 22 is between about 600 and 2000 Angstroms. Conventional photolithographic techniques and anisotropic plasma etching are used to pattern the gate electrodes 20, as shown in FIG. 1.

Lightly doped source/drain areas 16 are next formed adjacent to the gate electrodes 20. The lightly doped source and drain areas 16 for the N-FETs are formed by ion implantation of an N-type dopant, such as arsenic or phosphorus. For example, a typical implant might consist of phosphorus P$^{31}$ at a dose of between 1 E 13 to 10 E 13 atoms/cm$^2$ and an energy of between about 30 to 80 KeV. The gate electrodes serve as an implant mask to self-align the lightly doped source/drain areas 16 to the electrode, while an additional photoresist mask can be used to avoid unwanted implants elsewhere on the substrate.

After forming the lightly doped source/drain 16, sidewall spacers 24 are formed on the sidewalls of the gate electrode 20, also shown in FIG. 1. These sidewall spacers are typically formed by depositing a low-temperature silicon oxide, and then anisotropically etched back to the silicon surface. For example, the sidewall oxide can be deposited using LPCVD and tetraethoxysilane (TEOS) at a temperature in the range of about 650° to 900° C. and the etch back performed in a low pressure reactive ion etcher. An N$^+$ source/drain ion implantation is then used to complete the source/drain areas forming the N$^+$ doped source/drain contact areas 18 aligned to the sidewall spacers 24 and therefore also aligned to the lightly doped source/drain areas 16, as are also depicted in FIG. 1. A first insulating layer 26 is deposited using LPCVD and a reactant gas such as TEOS to electrically insulate the exposed source/drain contact areas 18. The preferred thickness of layer 26 is between about 1000 and 3000 Angstroms. Conventional photolithographic methods and plasma etching are used to etch the node contact openings for the stacked capacitors to one of the two source/drain contacts areas 18 of each pass transistor in the array of DRAM cells.

Referring now more specifically to FIGS. 2 through 7, the remainder of this embodiment teaches the method of fabricating the array of improved stacked storage capacitors having vertical sidewall portions on the array of DRAM cells. In accordance with the objects of this invention chemical mechanical polishing is used to planarize the first polysilicon layer and only two masking steps are required to form the bottom capacitor electrodes (capacitor node electrode) having vertical sidewall portions for increased capacitance.

Figure 2:
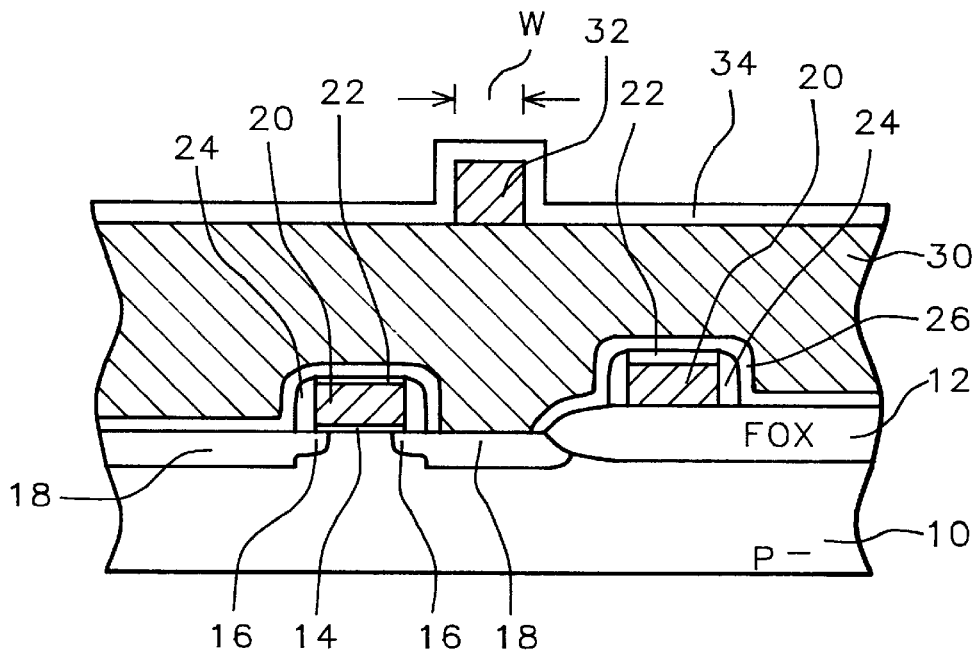

Referring now to FIG. 2, a relatively thick first polysilicon layer 30 is deposited and by the method of this invention is polished to form a global planar surface. This provides an improved surface for exposing distortion-free photoresist images thereon, and also provides an excellent surface for forming sidewall spacer structures. The first polysilicon layer 30 is preferably deposited by LPCVD using a reactant gas such as silane (SiH$_4$). Polysilicon layer 30 is then doped with an N-type dopant, such as phosphorus (P) to a concentration of between about 1.0 E 19 and 1.0 E 21 atoms/cm$^3$. For example, layer 30 can be doped by ion implantation using phosphorus P$^{31}$ ions. Alternatively, layer 30 can also be doped in situ during the LPCVD by adding a dopant gas such as phosphine (PH$_3$). The preferred thickness of layer 30 over the highest part of the underlying structure after polishing is at least 3000 Angstroms, and more specifically has a thickness of between about 3000 and 8000 Angstroms after polishing. The preferred method for forming the global planar polysilicon layer 30 is by chemical/mechanical polishing (CMP) using an appropriate polisher and polishing slurry.

After planarizing layer 30, a second insulating layer 32 is deposited and then patterned using conventional photolithographic techniques and anisotropic plasma etching. Layer 32 is preferably a chemical vapor deposited (CVD) silicon oxide (SiO$_2$). For example, oxide layer 32 can be deposited using LPCVD and a reactant gas such as tetraethosiloxane (TEOS). The preferred thickness of layer 32 is between about 1000 and 2500 Angstroms.

Figure 3:
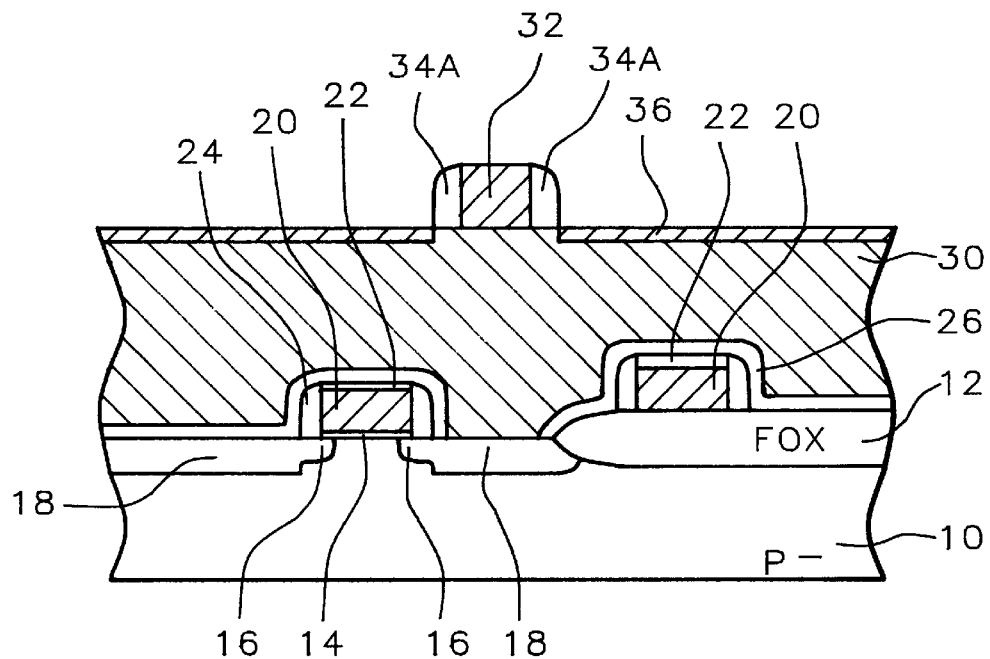

Still referring to FIG. 2, conventional photolithographic techniques are used to define a photoresist mask, and anisotropic plasma etching is now used to pattern the silicon oxide layer 32 leaving portions over the source/drain areas 18 where the array of bottom electrodes is required. Only one cell area of the array of cell areas is depicted in the Figs. to simplify the drawings and discussion. The plasma etching can be carried out in a reactive ion etcher (RIE) or a high density plasma etcher using an etchant gas such as carbon tetrafluoride (CF$_4$) so as to achieve a patterned oxide layer 32 with essentially vertical sidewalls. Alternatively the photoresist mask used to pattern layer 32 can be laterally recessed using isotropic plasma etching in oxygen (O$_2$). This further reduces the minimum feature size of the photoresist mask (not shown in FIG. 2) to extend the resolution limit of the photoresist. Therefore the minimum width W of the patterned oxide layer 32 can be less than the resolution of the photoresist. This isotropic plasma etch further reduces the area that the stacked capacitor occupies on the substrate. Continuing with the method, as shown in FIG. 2, a third insulating layer 34 is conformally deposited over the patterned layer 32 and elsewhere on the exposed polysilicon layer 30. More specifically layer 34 is composed of a material that provides an oxidation barrier during thermal oxidation. For example, layer 34 can be a silicon nitride (Si$_3$N$_4$) layer deposited to a thickness of between about 300 and 1000 Angstroms. The third insulating layer 34 is then anisotropically plasma etched back to the surface of the polysilicon layer 30 to form the sidewall spacers 34A, as shown in FIG. 3. Preferably this blanket etch back can be carried out using high density plasma etching or RIE, and an etchant gas mixture containing $CF_4$ and a carrier gas such as argon (Ar) or helium (He).

Referring still to FIG. 3, the substrate 10 is subjected to a thermal oxidation to form the polysilicon oxide ($SiO_2$) layer 36 on the exposed surface of the polysilicon layer 30. This polysilicon oxide layer 36 and the patterned oxide layer 32 are later used as an etch masking layer for etching deep trenches in polysilicon layer 30. The thermal oxidation is preferably carried out in an oxidation furnace using a steam ambient. The oxidation is typically done at a temperature of between about 800° and 900° C. for a time of about 10 to 40 minutes, or for a time sufficient to grow between about 200 and 600 Angstroms of silicon oxide on the polysilicon surface. The silicon nitride sidewall spacers 34A prevent the oxidation of the polysilicon layer thereunder.

Figure 4:
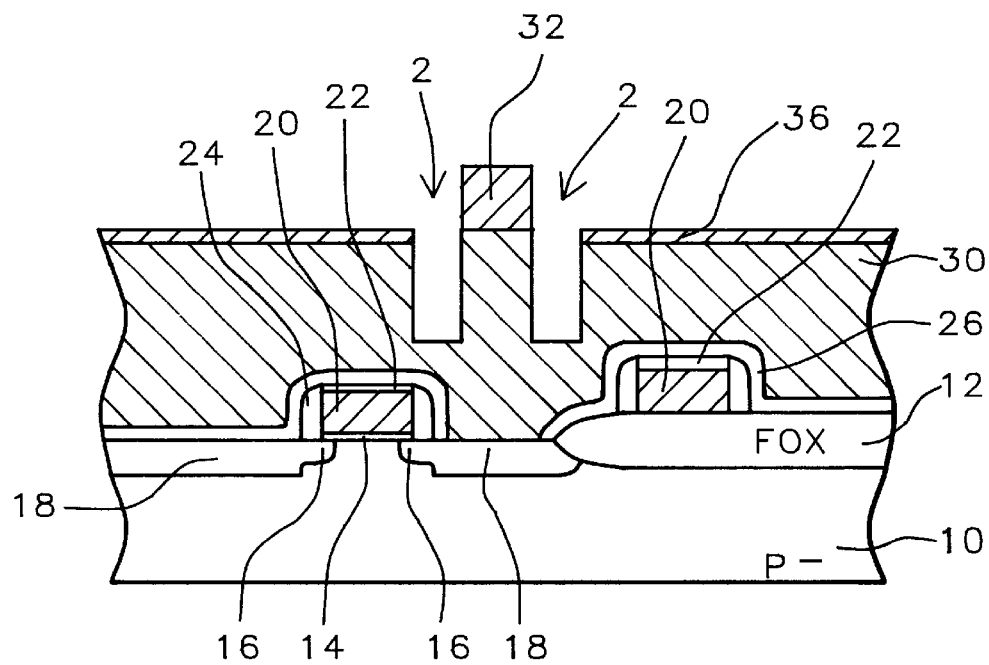

Referring now to FIG. 4, the silicon nitride spacers 34A are then removed, exposing portions of the polysilicon layer 30 thereunder. The spacers 34A composed of silicon nitride are best removed by wet etching in a solution of hot phosphoric acid ($H_3PO_4$) at a temperature in the range between 155° and 180° C. Still referring to FIG. 4, deep trenches, or recesses, 2 are etched in the first polysilicon layer 30 using the polysilicon oxide layer 36 and the second insulating layer 32 as an etching mask. The width of the recesses 2 is determined by the width of the spacers 34A (FIG. 3) and therefore can exceed the resolution limit of the current photolithography. By way of example only, if the spacers 34A are about 0.1 micrometers in width, then the recesses 2 in layer 30 are also of essentially the same width. As will soon become apparent, the recesses 2 form the inner sidewalls for the bottom electrodes of the DRAM stacked capacitors. The trenches are preferably etched using an anisotropic plasma etch in a low pressure high density plasma etcher and having a high etch rate ratio of silicon to silicon oxide. Preferably an etchant gas mixture containing an atomic chlorine (Cl) species can be used. For example, a gas mixture containing hydrogen bromide (HBr) and chlorine ($Cl_2$) or sulfur hexafluoride ($SF_6$) and $Cl_2$ can be employed having an etch rate ratio of polysilicon to silicon oxide greater than about 15:1. The recesses (trenches) are etched to a preferred depth of between about 2000 and 6000 Angstroms having essentially vertical sidewalls.

Figure 5:
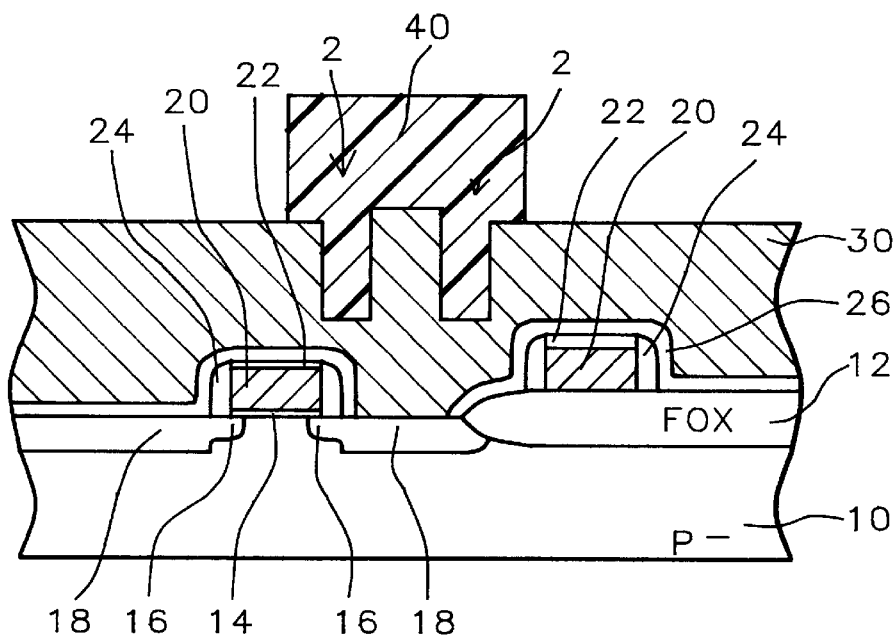

Now as shown in FIG. 5, the silicon oxide masking layers 36 and 32 are then concurrently removed using a dilute solution of hydrofluoric acid and water ($HF/H_2O$). After removing layers 32 and 36, a photoresist mask 40 is patterned using conventional photolithographic techniques leaving portions aligned over the trenches 2 which define the outer perimeter of the bottom electrodes.

Figure 6:
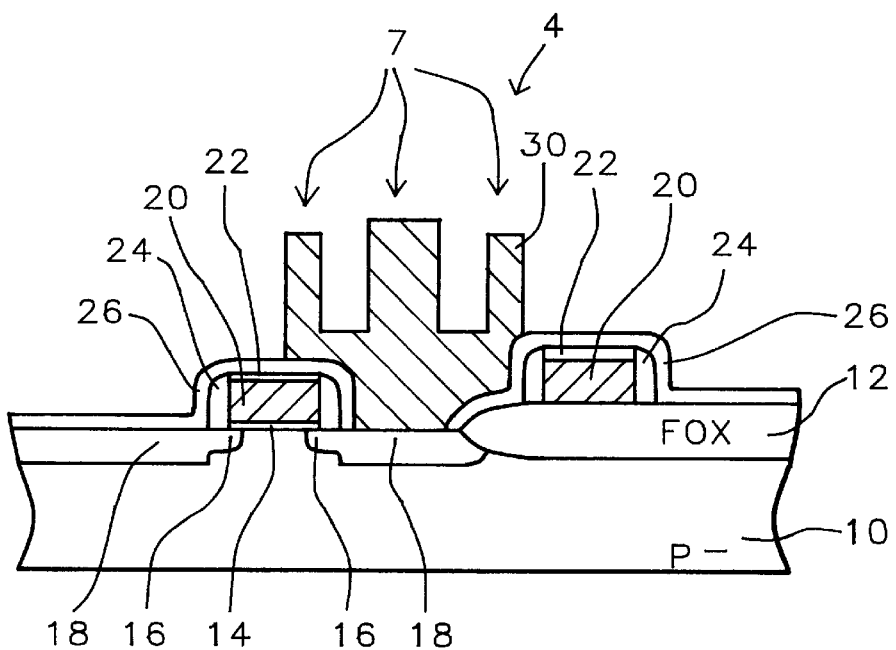

Now as shown in FIG. 6, the exposed first polysilicon layer 30 is then anisotropically plasma etched to the first insulating layer 26, thereby providing an array of capacitor bottom electrodes electrically isolated from each other. Only one of the bottom electrodes of the array of electrodes is depicted in FIG. 6. The etching also forms the outer sidewalls of the deep bottom electrode 4. The etching of the deep trenches and patterning of the bottom electrodes thereby form vertical sidewall portions 7 for the stacked capacitors. Preferably the etching is carried out using RIE and an etchant gas mixture having a high etch rate selectivity of polysilicon to silicon oxide. For example, the same etching used to form the deep trenches 2 can also be used to pattern the bottom electrodes 4.

Figure 7:
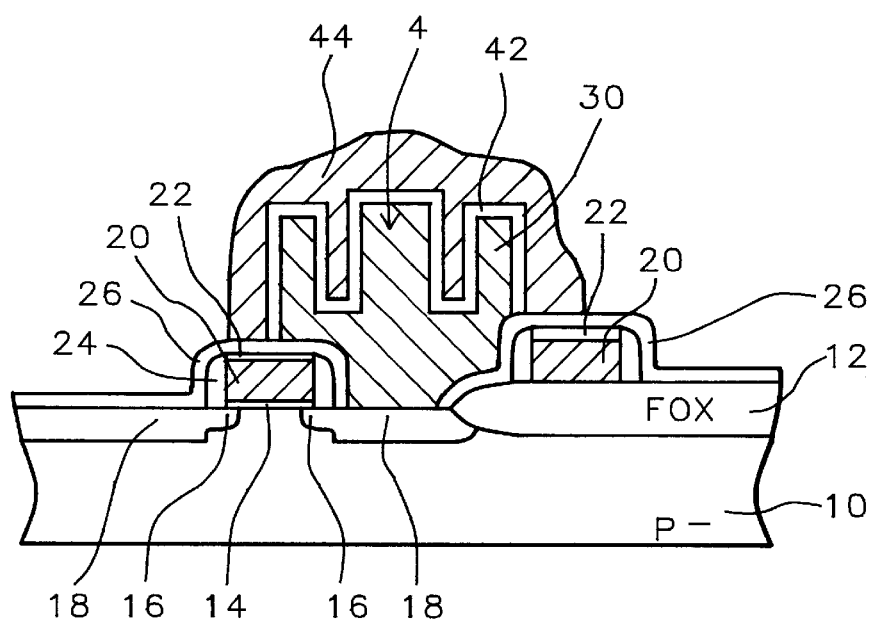

The array of vertical walled stacked storage capacitors for the DRAM cells is now completed, as shown in FIG. 7. The continuing process involves forming a capacitor interelectrode dielectric layer 42 on the surface of the capacitor bottom electrode 4 composed of the recessed layer 30. The dielectric layer 42 is preferably composed of silicon oxide and silicon nitride (ON). Alternatively, the dielectric can be composed of a multilayer of silicon oxide, silicon nitride and silicon oxide (ONO). For example, the dielectric layer 42 composed of silicon oxide—silicon nitride—silicon oxide can be formed by thermally oxidizing the bottom electrode. After depositing a silicon nitride layer using, for example, low pressure chemical vapor deposition (LPCVD) and a reactive gas mixture of ammonia ($NH_3$) and dichlorosilane ($SiH_2Cl_2$), a wet oxygen can be used at a temperature of about 850° C. for about 10 minutes to partially convert the silicon nitride to an oxide. The preferred total thickness of the interelectrode dielectric layer 42 is between about 30 and 100 Angstroms. In addition, other commonly practiced methods can be used to further increase the capacitance, such as roughing the electrode surface and by using interelectrode materials having higher dielectric constants, such as tantalum pentoxide ($Ta_2O_5$). A second polysilicon layer 44 is deposited on the interelectrode dielectric layer 42. Layer 44 conformally covers the bottom electrode and forms the top electrode for stacked storage capacitors. Layer 44 is preferably deposited by LPCVD and is in-situ doped N-type. The preferred thickness of polysilicon layer 44 is between about 1000 and 2000 Angstroms and is doped with an N-type dopant impurity, such as with phosphorus (P). The preferred concentration of phosphorus in layer 44 is in the range of between about 5.0 E 19 to 1.0 E 21 atoms/$cm^3$. The polysilicon layer 44 is then patterned using conventional photolithographic techniques and plasma etching to form the top electrodes and complete the array of stacked storage capacitors having increased capacitance. Only one of the capacitors of the array is depicted in FIG. 7.

While the invention has been particularly shown and described with reference to the preferred embodiment thereof, it will be understood by those skilled in the art that various changes in form and details may be made without departing from the spirit and scope of the invention.

What is claimed is:

1. A method for fabricating stacked storage capacitors on a semiconductor substrate, comprising the steps of:

providing said semiconductor substrate having device areas surrounded and electrically isolated from each other by field oxide areas, said device areas having semiconductor devices formed, in part, from a patterned polycide layer, and having device contact areas in said device areas, said semiconductor substrate coated with a first insulating layer having contact openings to said device contact areas and further forming said stacked storage capacitors by;

depositing a first polysilicon layer on said semiconductor substrate over said first insulating layer and electrically contacting said device contact areas;

planarizing said first polysilicon layer by chemical mechanical polishing;

depositing a second insulating layer on said first polysilicon layer;

patterning said second insulating layer by photoresist masking and laterally recessing said photoresist masking by isotropic plasma etching in oxygen to further reduce a minimum feature size of said photoresist masking;

anisotropically etching and leaving portions of said second insulating layer having vertical sidewalls over said device contact areas where said stacked capacitors are to be formed;

depositing a conformal third insulating layer on said second insulating layer, said third insulating layer providing a barrier to thermal oxidation;

anisotropically etching back said third insulating layer, thereby forming sidewall spacers on said sidewalls of said patterned second insulating layer and further exposing said first polysilicon layer elsewhere on said semiconductor substrate;

forming a polysilicon oxide on said exposed first polysilicon layer by thermal oxidation;

selectively removing said sidewall spacers, thereby exposing said first polysilicon layer thereunder;

forming trenches in said first polysilicon layer by anisotropic plasma etching while using said second insulating layer and said polysilicon oxide as an etching mask, thereby forming inner sidewalls for bottom electrodes for said stacked capacitors;

removing concurrently said second insulating layer and said polysilicon oxide by wet etching:

forming a patterned photoresist mask having portions over said trenches thereby defining an outer perimeter of said bottom electrodes for an array of stacked capacitors;

anisotropic plasma etching said first polysilicon layer to said first insulating layer and thereby forming said array of said bottom electrodes having vertical sidewalls;

forming an interelectrode dielectric layer on said bottom electrodes;

depositing a second polysilicon layer;

patterning said second polysilicon layer forming top electrodes thereby completing said stacked storage capacitors.

2. The method of claim 1, wherein said patterned polycide layer is composed of an $N^+$ doped polysilicon layer having a tungsten silicide ($WSi_2$) on surface of said $N^+$ doped polysilicon layer.

3. The method of claim 1, wherein said first insulating layer is composed of silicon oxide ($SiO_2$) having a thickness of between about 1000 and 3000 Angstroms.

4. The method of claim 1, wherein said first polysilicon layer is conductively doped $N^+$ having a dopant concentration of between about 1.0 E 19 and 1.0 E 21 atoms/cm$^3$.

5. The method of claim 1, wherein said first polysilicon layer after said planarization is at least 3000 Angstroms thick.

6. The method of claim 1, wherein said trenches in said first polysilicon layer are at least 2000 Angstroms deep.

7. The method of claim 1, wherein said second insulating layer is a chemical vapor deposited silicon oxide having a thickness of between about 1000 and 2500 Angstroms.

8. The method of claim 1, wherein said third insulating layer is deposited to a thickness of between about 300 and 1000 Angstroms.

9. The method of claim 1, wherein said sidewall spacers are silicon nitride and are removed by wet etching in hot phosphoric acid.

10. The method of claim 1, wherein said polysilicon oxide is grown to a thickness of at least 200 Angstroms.

11. The method of claim 1, wherein said second polysilicon layer is doped $N^+$ with phosphorus to a concentration of between about 5.0 E 19 and 1.0 E 21 atoms/cm$^3$.

* * * * *